(12) United States Patent
Okuma et al.

(10) Patent No.: US 6,392,139 B1
(45) Date of Patent: May 21, 2002

(54) SHIELD CASE FOR A RADIO-FREQUENCY APPLIANCE

(75) Inventors: Hideyuki Okuma, Hirakata; Toshiyuki Harada, Higashiosaka, both of (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/817,763

(22) Filed: Mar. 27, 2001

(30) Foreign Application Priority Data

Mar. 27, 2000 (JP) .......................................... 2000-086033

(51) Int. Cl.[7] .................................................. H05K 9/00
(52) U.S. Cl. ....................... 174/35 R; 361/816; 220/62; 220/557
(58) Field of Search .................... 174/35 R, 35 MS; 361/816, 818, 800; 220/62, 557

(56) References Cited

U.S. PATENT DOCUMENTS 4,370,515 A * 1/1983 Donaldson ................. 174/35 R
4,816,613 A * 3/1989 Ito et al. .................... 174/35 R
5,895,884 A * 4/1999 Davidson .................. 174/35 R

* cited by examiner

Primary Examiner—Dean A. Reichard
Assistant Examiner—Hung V Ngo
(74) Attorney, Agent, or Firm—Armstrong, Westerman & Hattori, LLP

(57) ABSTRACT

A shield case includes first and second side plates formed by blanking a metal sheet. Between the first side plate and the second side plate, two shield plates are formed connected to the side plates through connecting portions. One shield plate has, in one end edge, a protuberance and, in the other end edge, a shield plate formed through a connecting portion. Bending allowances are formed respectively in the first and second side plate in areas between the connecting portions. During assembling, the bending allowances of the first and second side plates are bent inward between the shield plates.

5 Claims, 6 Drawing Sheets

PRIOR ART

SHIELD CASE FOR A RADIO-FREQUENCY APPLIANCE

BACKGROUND OF THE INVENTION

1. Field of the Invention

This invention relates generally to shield cases for radio-frequency appliances and, more particularly, to a shield case for a radio-frequency appliance formed in a state of development by blanking a metal sheet such as of iron, stainless steel, aluminum, copper or phosphor bronze to be assembled upon being mounted onto a circuit board.

2. Description of the Prior Art

For the radio-frequency appliances, there is a proposal of doubly providing the shield plates in order to exclude radio-frequency interference.

FIGS. 1 and 2 show a first prior art of a shield case for a radio-frequency appliance of this kind. FIG. 1 shows an assembled state while FIG. 2 a development state. The first prior-art shield case includes two side plates 2 and 3 formed by blanking a metal sheet and two shield plates 4 and 5 formed connected to the side plates 2 and 3 through connecting portions and arranged close to each other due to assembling. Protuberances 4a and 5a are formed in respective opposite end edges of the two shield plates 4 and 5 in a development state, so that they can be inserted in a circuit board (not shown) and connected to a reference potential. Also, a recess 4b can be formed in an end edge of the shied plate 4 opposite to the protuberance 4a so that it can be engaged with a shield plate 6 due to assembling.

In assembling the first prior art, the shield plates 4 and 5 are twisted such that the surfaces of the shield plates 4 and 5 shown in FIG. 2 are positioned outward. The protuberances 4a and 5a are inserted in and soldered to the insertion holes of the circuit board. Thereafter, a protuberance 6a of the shield plate 6 is inserted in a circuit-board hole in the similar manner and a protuberance 6b is engaged with the recess 4b of the shield plate 4.

In the case of a second prior-art shield case 1 shown in FIG. 3 and FIG. 4, a metal sheet is blanked in a manner similar to the first prior art, to form two side plates 2 and 3 as well as two shield plates 4 and 5 connected between the side plates 2 and 3 through connecting portions. Protuberances 4a and 5a are formed in end edges of the two shield plates 4 and 5 on the same side in a development state. In this case, a recess 5b is formed in an end edge of the shield plate 5 in order to allow the protuberance 4a of the shield plate 4 to escape.

In assembling the second prior art, the shield plates 4 and 5 are twisted such that one of the surfaces of the shield plates 4 and 5 shown in FIG. 4 is on an inner side and the other outward. The protuberance 4a and 5a are inserted in and soldered to the insertion holes of the circuit board.

In the first prior art, the shield plate 6 is formed as a separate member thus increasing the number of parts. However, in the first prior art, the shield plate 6 can be formed in one body with the shield plate 4 if increasing the distance between the shield plate 4 and the shield plate 5. In this case, however, the shield case will increase in size. Therefore, the shield plate 6 must be made as a separate member in the case there exists a restriction in space or shape.

In the second prior art, where the spacing between the shield plate 4 and the shield plate 5 has to be decreased due to the limitation of circuit arrangement or the like, the recess 5b of the shield plate 5 must be made greater as the two shield plates 4 and 5 are arranged closer to each other, thus resulting in deterioration in shield effects.

SUMMARY OF THE INVENTION

Therefore, it is a primary object of this invention to provide a novel shield case for a radio-frequency appliance.

Another object of the invention is to provide a shield case for a radio-frequency appliance capable of comparatively freely coping with circuit arrangement and securing shield effects while having side plates and shield plates formed by blanking one metal sheet.

A shield case for a radio-frequency appliance according to the present invention comprises: first and second side plates formed by blanking a metal sheet; first and second shield plates formed with spacing between the first side plate and the second side plate; a first connecting portion connecting the first shield plate to both the first side plate and the second side plate; a second connecting portion connecting the second shield plate to both the first side plate and the side plate; a first bending allowance formed between the first connecting portion and the second connecting portion of the first side plate; a second bending allowance. formed between the first connecting portion and the second connecting portion of the second side plate, wherein the first bending allowance and the second bending allowance during assembling are bent inward between the first shield plate and the second shield plate.

Where a projection for setting a reference potential is provided in the shield plate, a protuberance is formed protruding toward the second shield plate from a first end edge of the first shield plate on a side close to the second shield plate in a development state, wherein the first bending allowance and the second bending allowance are set each to have a length greater than a length of the protuberance.

Where integrating a third shield plate, a third shield plate is formed in a second end edge of the first shield plate on a side opposite to the first end edge through a third connecting portion.

If there is reduction in shield effect when bending inward the bending allowances, the bent portions at outer side are shielded by the engaging portions. Specifically, the first bending allowance is formed in a widthwise part of the first side plate and the second bending allowance is formed in a widthwise part of the second side plate, further comprising a first engaging portion to be engaged with another widthwise portion of the first side plate by sandwiching the first bending allowance; and a second engage portion to be engaged with another widthwise portion of the second side plate by sandwiching the second bending allowance, wherein when the first bending allowance and the second bending allowance are bent inward, the first engaging portion is engaged together and the second engaging portion is engaged together.

When assembling a shield plate having, in a development state, a first bending allowance formed between a first connecting portion and a second connecting portion of the first side plate and a second bending allowance formed between a first connecting portion and a second connecting portion of the second side plate, the first and second side plates as well as the first and second shield plates are twisted by 90 degrees to a perpendicular position to a circuit board. In this case, because the first and second bending allowances are bent inward between the first and second shield plates, the spacing between the first and second shield plates, even if great in the development state, can be decreased. For example, where forming protuberances in the side end edges of the first and second shield plates in the development state, the distance between the first shield plate and the second shield plate increases. In such a case, however, it is satisfactory to set the first and second bending allowances with length greater than a length of the protuberance in the development state and these bending allowances are bent inward during assembling.

According to the present invention, one metal sheet is blanked so that a sheet left is bent to form various portions into one body, thus reducing the number of parts and simplifying assembling operation. Furthermore, as compared to combination with separate parts, positional accuracy is improved and electric characteristic is stabilized, resulting in improved quality. Meanwhile, it is possible to reduce cost, i.e. the die cost required for separate parts. Furthermore, the provision of bending allowances allows for setting, in a development state, a spacing between the first and second shield plates freely, thus simplifying design.

The above described objects and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 5:
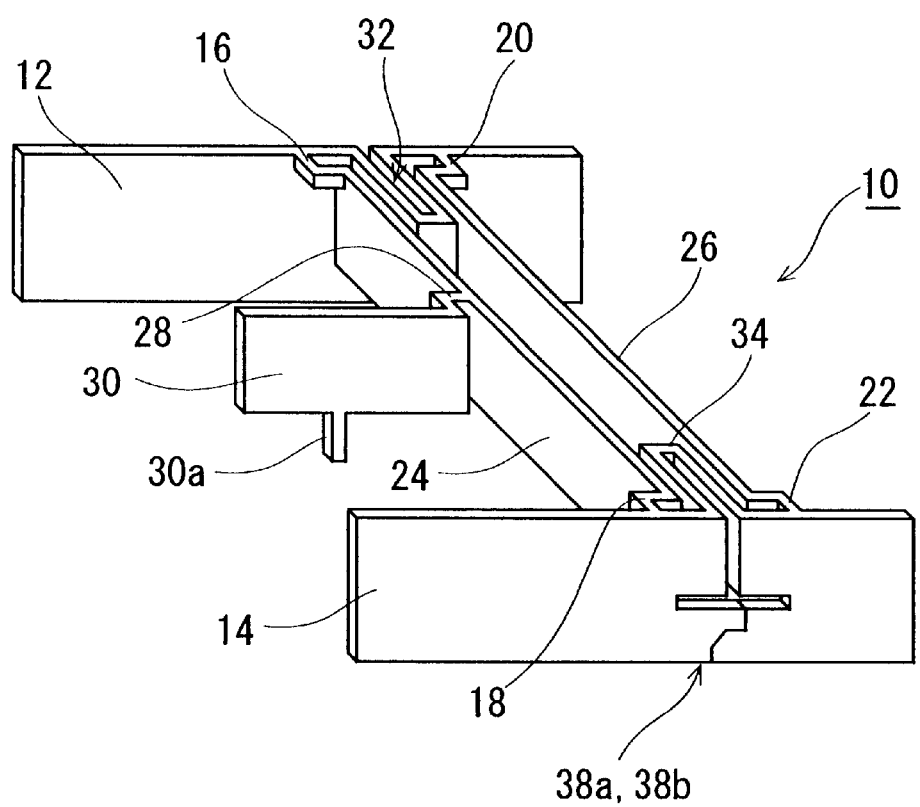
FIG. 5 is a perspective view showing an embodiment of this invention.
Figure 6:
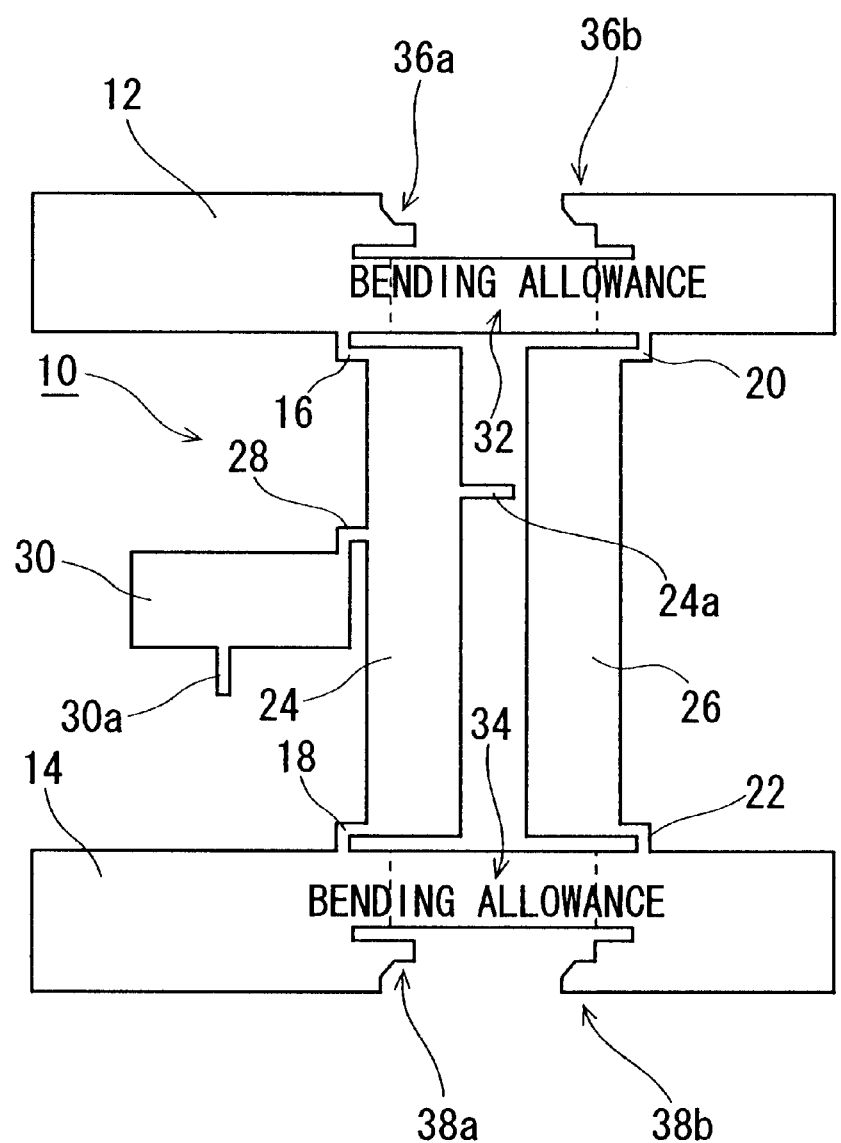
FIG. 6 is a development view showing the FIG. 5 embodiment.

Referring to FIG. 5 and FIG. 6, a shield case 10 of this embodiment is formed by blanking a metal sheet similarly to the foregoing prior art. In FIG. 6 showing a development state, the shield case 10 includes two side plates 12 and 14 as well as two shield plates 24 and 26 formed connecting between the side plates 12 and 14 through a first connecting portion 16, first connecting portion 18, second connecting portion 20 and second connecting portion 22.

Figure 1:
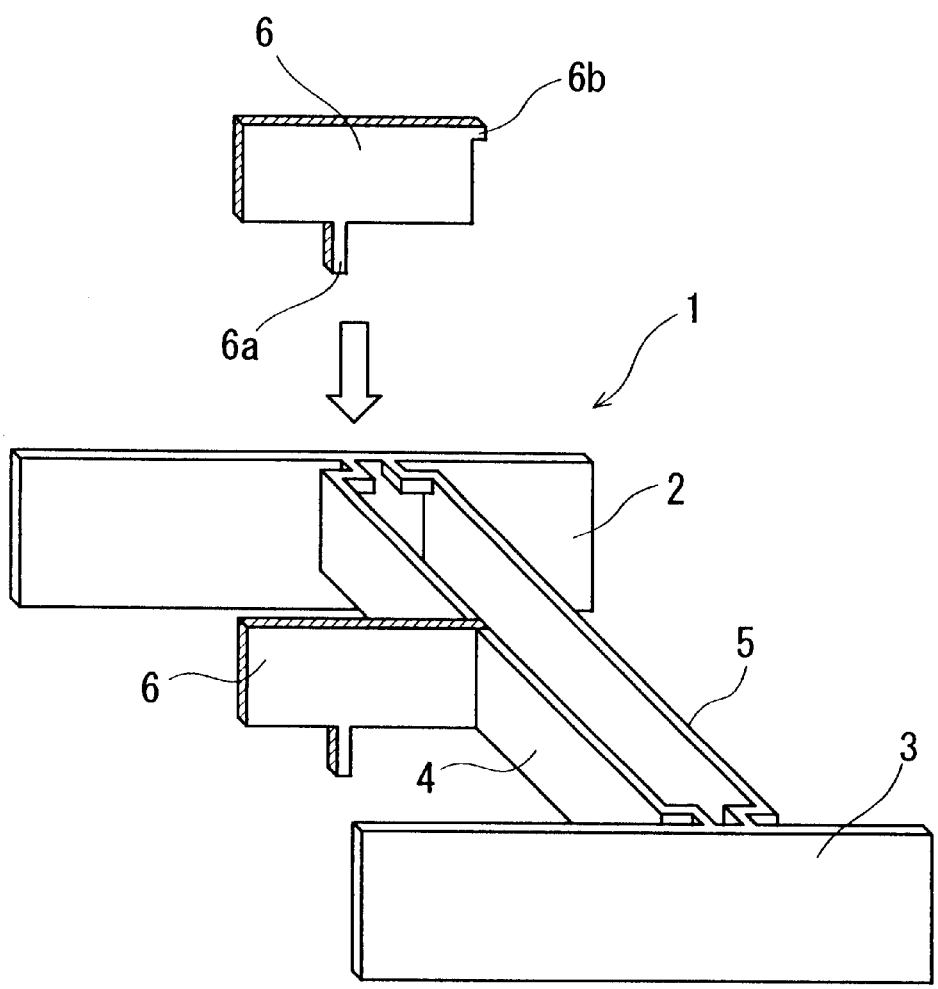
FIG. 1 is a perspective view showing an example of a conventional shield case for a radio-frequency appliance.
Figure 2:
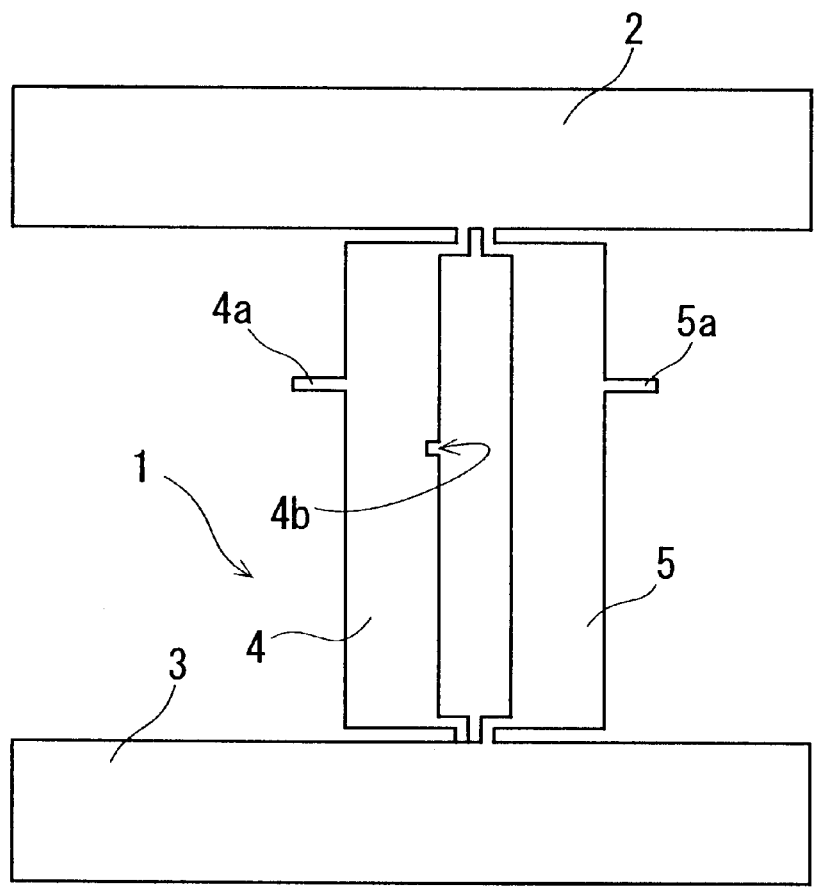
FIG. 2 is a development view of the FIG. 1 prior art.
Figure 3:
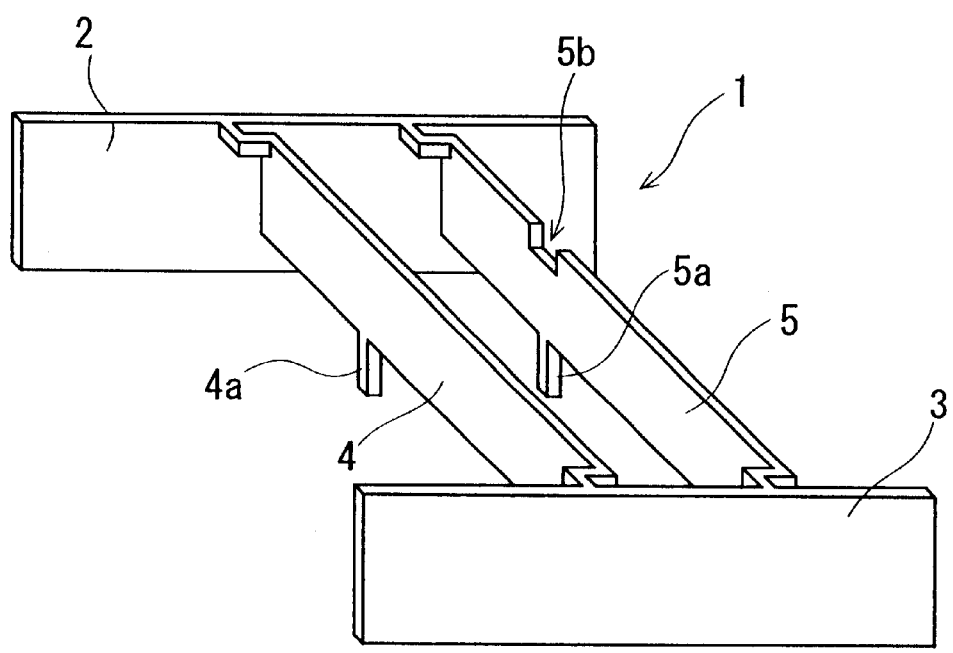
FIG. 3 is a perspective view showing another example of a structure of a conventional shield case for a radio-frequency appliance.
Figure 4:
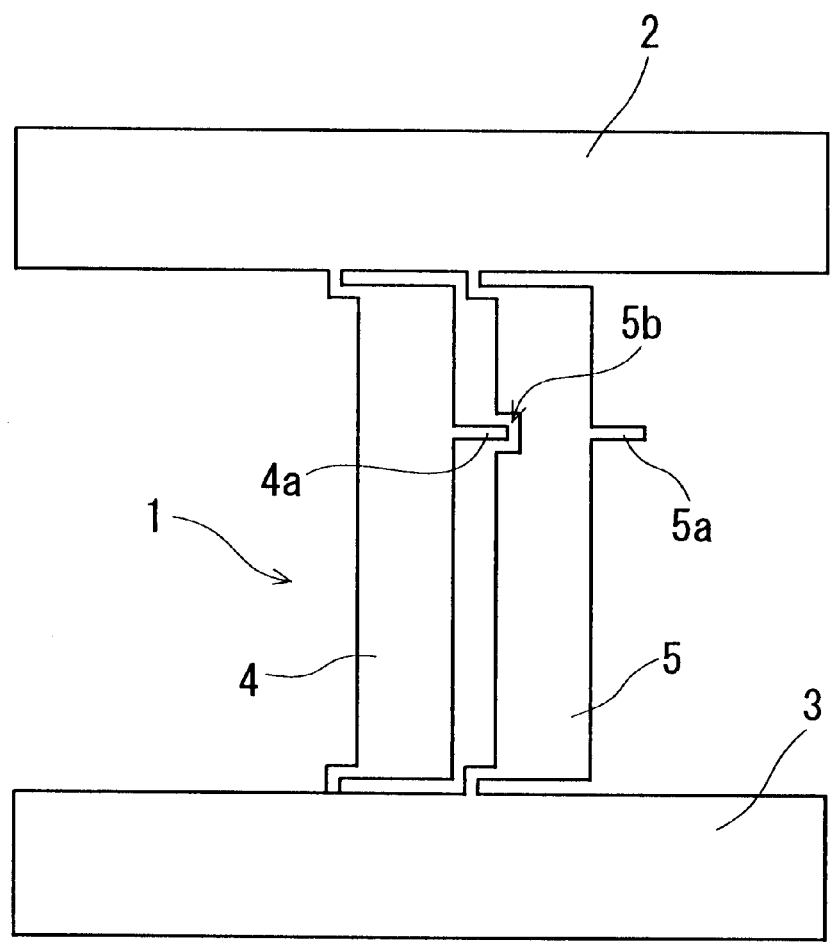
FIG. 4 is a development view of the FIG. 3 prior art.

A protuberance 24a is formed in a first end edge of the first shield plate 24 that is positioned on a side close to a second shield plate 26 in a development state. The protuberance 24a is to be inserted in a board (not shown) and connected to a reference potential. Accordingly, the spacing between the first shield plate 24 and the second plate 26 is given greater than a length of the protuberance 24a. Although the prior art of FIG. 3 formed a protuberance in one shield plate and a cut-out or recess in the other shield plate to allow the protuberance to escape, this embodiment provides a distance greater than a length of the protuberance 24a to between the shield plates 24 and 26. This prevents the shield effect from being reduced by the recess.

Also, third shield plate 30 is formed in a second end edge of the shield plate 24 on a side opposite to the protuberance 24a, which is integrally connected to the shield plate 24 through a connecting portion 28. The shield plate may be formed with a protuberance 30a for connection to the reference potential.

Because the shield 30 can be formed in the shield plate 24 on a side opposite to the shield plate 26, there is no need to form the third shield plate as a separate member. However, this third shield plate 30 where unnecessary can be omitted.

The shield case 10 of this embodiment is characterized by the first and second side plates 12 and 14. That is, the first side plate 12, in an area between the first connecting portion 16 and the second connecting portion 20, is formed as a bending allowance 32 having a width of nearly a half of the entire width of the side plate 12. Similarly, the second side plate 14, in an area between the first connecting portion 18 and the second connecting portion 22, is formed as a bending allowance 34 having a width of nearly a half of the entire width of the side plate 14. Furthermore, two engaging portions 36a and 36b are formed in an area above the bending allowance 32 of the side plate 12 such that they project in a nest relation to each other from the positions corresponding to the opposite ends of the bending allowance 32. Engaging portions 38a and 38b are formed similarly in the side plate 14 in an area above the bending allowance 34.

During assembling, as shown in FIG. 5 the two side plates 12 and 14 are bent at the connecting portions 16–20 by 90 degrees such that the surfaces appearing in FIG. 6 are both directed outward. The shield plate 24 and the shield plate 26 are bent at the connecting portions 16–22 by 90 degrees such that the surfaces thereof shown in FIG. 6 are directed inward. That is, the two side plates 12 and 14 are twisted in opposite directions, and the shield plates 24 and 24 are likewise twisted in opposite directions. The third shield plate 30 is also bent at the connecting portion 28 by 90 degrees toward the same direction as that of the side plate 14.

At this time, the first bending allowance 32 and the second bending allowance 34 respectively provided in the first side plate 12 and the second side plate 14 are bent to a point where connections are made between the first connecting portions 36a and 36b in the first side plate 12 as well as between the second connecting portions 38a and 38b in the second side plate 14, as shown in FIG. 5. The distance between the shield plate 24 and the shield plate 26 can be freely provided to meet the circuit configuration of the circuit board (not shown) by the length of the bending allowance 32 and 34 and the bending amount thereof. Accordingly, even where the shield plate 24 and the shield plate 26 are arranged close in distance between them, the shield plate 30 can be formed together with the other shield plates by use of one metal sheet.

Then, a shield case 10 assembled as in FIG. 5 is rested on the circuit board. The protuberances 24a and 30 are inserted in the circuit-board holes (not shown) and soldered to the grounding reference potential.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A shield case for a radio-frequency appliance, comprising:

first and second side plates formed by blanking a metal sheet;

first and second shield plates formed with spacing between said first side plate and said second side plate;

a first connecting portion connecting said first shield plate to both said first side plate and said second side plate;

a second connecting portion connecting said second shield plate to both said first side plate and said second side plate;

a first bending allowance formed between said first connecting portion and said second connecting portion of said first side plate;

a second bending allowance formed between said first connecting portion and said second connecting portion of said second side plate, wherein said first bending allowance and said second bending allowance during assembling are bent inward between said first shield plate and said second shield plate.

2. A shield case according to claim 1, further comprising a protuberance protruding toward said second shield plate from a first end edge of said first shield plate on a side close to said second shield plate in a development state, wherein said first bending allowance and said second bending allowance are set each to have a length greater than a length of said protuberance.

3. A shield case according to claim 1 or 2, further comprising a third shield plate provided in a second end edge of said first shield plate on a side opposite to said first end edge through a third connecting portion.

4. A shield case according to claim 1 or 2, wherein said first bending allowance is formed in a widthwise part of said first side plate and said second bending allowance is formed in a widthwise part of said second side plate, further comprising a first engaging portion to be engaged with another widthwise portion of said first side plate by sandwiching said first bending allowance; and a second engage portion to be engaged with another widthwise portion of said second side plate by sandwiching said second bending allowance, wherein when said first bending allowance and said second bending allowance are bent inward; said first engaging portion is engaged together and said second engaging portion is engaged together.

5. A shield case according to claim 3, wherein said first bending allowance is formed in a widthwise part of said first side plate and said second bending allowance is formed in a widthwise part of said second side plate, further comprising a first engaging portion to be engaged with another widthwise portion of said first side plate by sandwiching said first bending allowance; and a second engage portion to be engaged with another widthwise portion of said second side plate by sandwiching said second bending allowance, wherein when said first bending allowance and said second bending allowance are bent inward; said first engaging portion is engaged together and said second engaging portion is engaged together.

* * * * *